United States Patent [19]

Rose

[11] Patent Number: 5,365,655
[45] Date of Patent: Nov. 22, 1994

[54] METHOD OF MAKING AN ELECTRONIC MODULE FOR A MEMORY CARD AND AN ELECTRONIC MODULE THUS OBTAINED

[75] Inventor: René Rose, Voisin-Le-Bretonneux, France

[73] Assignee: Schlumberger Industries, Montrouge, France

[21] Appl. No.: 835,246

[22] Filed: Feb. 13, 1992

[30] Foreign Application Priority Data

Feb. 18, 1991 [FR] France .................. 91 01904

[51] Int. Cl.⁵ .............................................. H01R 43/00
[52] U.S. Cl. ................................ 29/627; 257/695; 437/217
[58] Field of Search ................. 257/695; 437/217; 29/827; 428/901

[56] References Cited

U.S. PATENT DOCUMENTS

| | | | |
|---|---|---|---|
| 4,460,825 | 7/1984 | Haghiri-Tehrani et al. | 29/827 X |
| 4,641,418 | 2/1987 | Meddles | 437/217 |
| 4,829,666 | 5/1989 | Haghiri-Tehrani et al. | 29/827 X |
| 5,018,003 | 5/1991 | Yasunaga et al. | 257/695 X |
| 5,064,706 | 11/1991 | Ueda et al. | 428/901 X |
| 5,096,853 | 3/1992 | Yasunaga et al. | 437/217 X |
| 5,134,773 | 8/1992 | Le Maire et al. | 437/217 X |
| 5,139,969 | 8/1992 | Mori | 437/217 X |
| 5,197,183 | 3/1993 | Chia et al. | 29/827 |

*Primary Examiner*—Arbes, Carl J.
*Attorney, Agent, or Firm*—Frishauf, Holtz, Goodman & Woodward

[57] ABSTRACT

The invention relates to a method of making electronic modules for electronic memory cards and to electronic modules thus obtained. Starting with a metal strip, in which patterns have been cut out and to which semiconductor chips have been attached, this assembly is placed in the cavity of a transfer mold. The cavity has two portions located on the two sides of the strip in order to ensure a good mechanical bond between the conductive parts of the pattern before it is cut from the remainder of the strip.

4 Claims, 2 Drawing Sheets

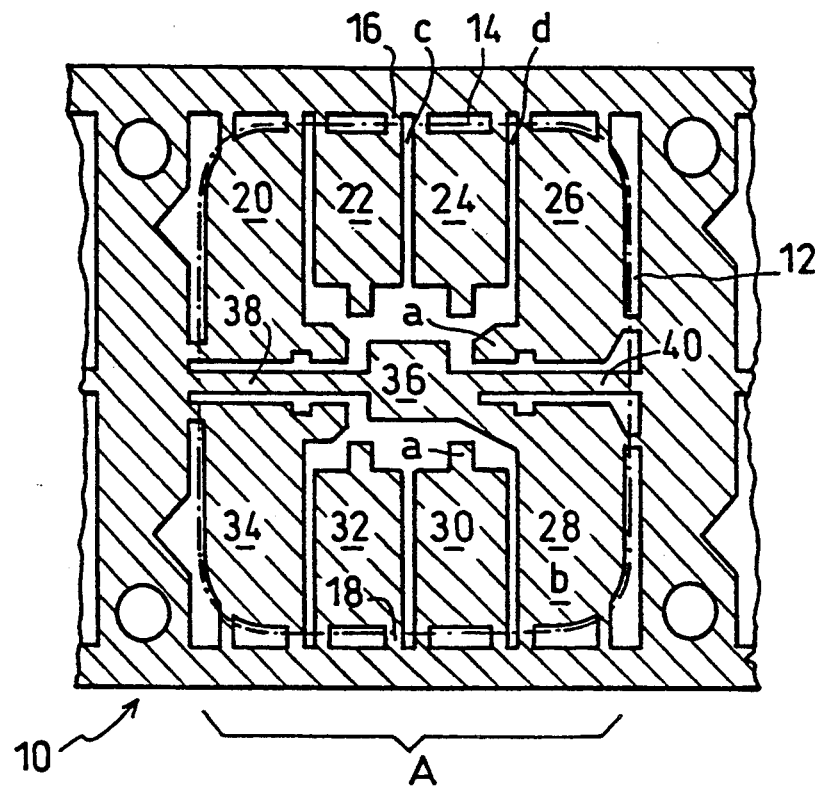
fig_1
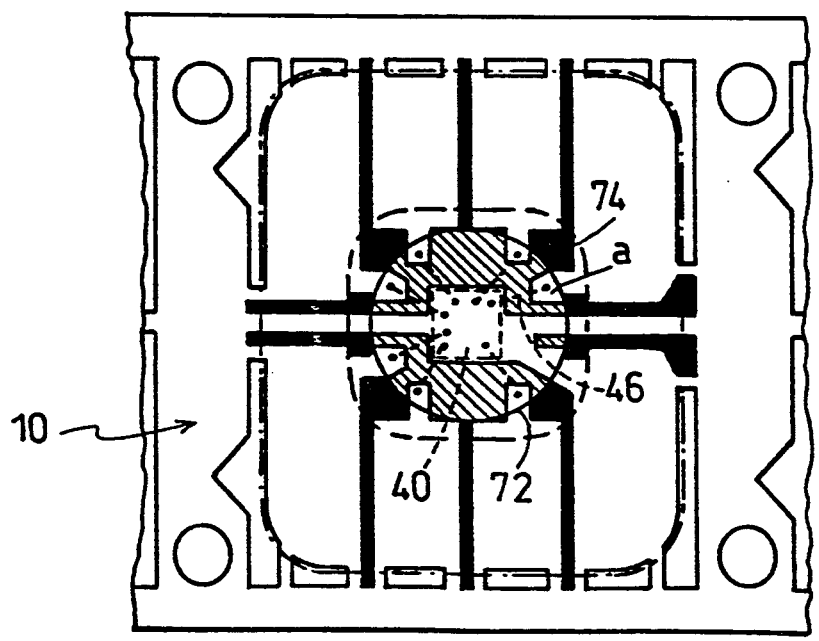
fig_3

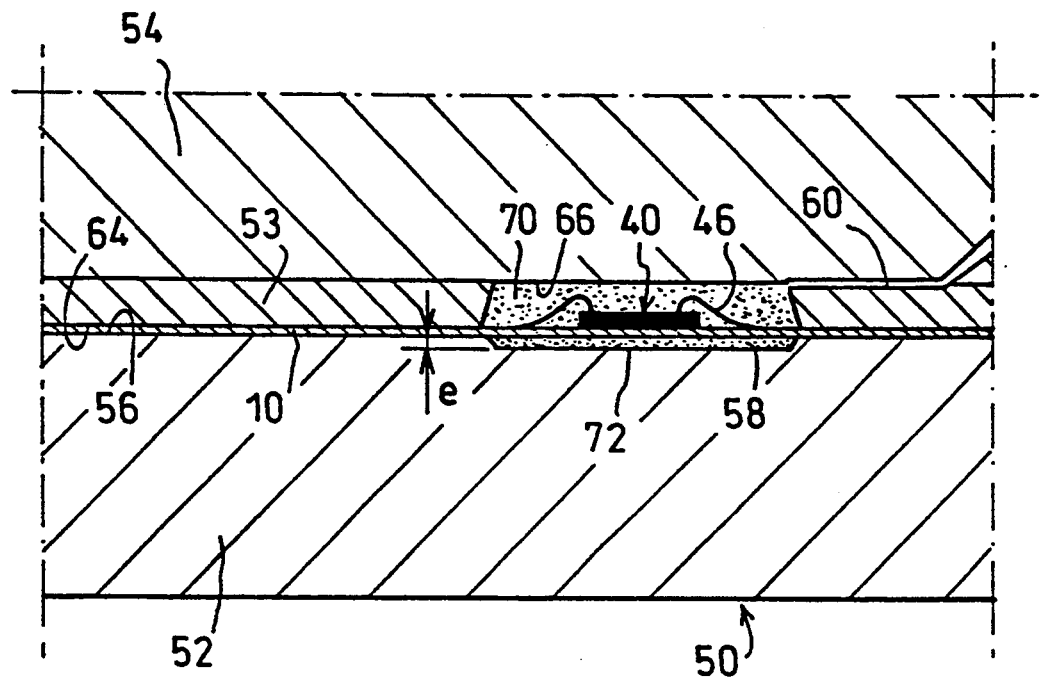
fig_2
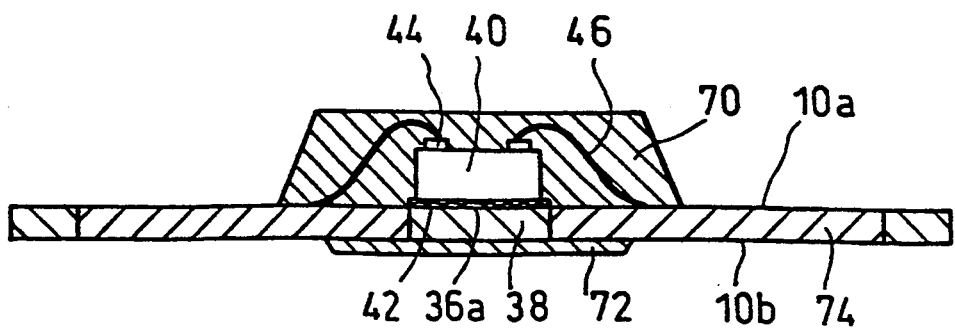
fig_4

METHOD OF MAKING AN ELECTRONIC MODULE FOR A MEMORY CARD AND AN ELECTRONIC MODULE THUS OBTAINED

The present invention relates to a method of making an electronic module for a memory card and to electronic modules obtained by use of the method.

BACKGROUND OF THE INVENTION

As is well known, a memory card basically comprises a card body of substantially rectangular shape, made from a plastic material, and an electronic module fixed to the card body, this electronic module being formed basically by a support part and by a semiconductor chip fixed to the support part.

More particularly, the support part has electric contacts on its outer face, for making contact with the connector of the card reader, and has on its other face a semiconductor chip electrically connected to conductive regions of the support part, for example by conductive wires. Usually the assembly formed by the semiconductor chip and the conductive wires is encapsulated in an insulating material for mechanical protection and electrical insulation.

Memory cards have to adhere to various characteristics defined by very precise standards, such as ISO 7810. Among the specifications imposed on cards, the first lies in that the thickness of the card has to be within very tight tolerances around the value of 0.8 mm. In consequence, it is necessary for the electronic module to have a very small thickness, so that it can be fixed in the card body. A second specification lies in that the card fitted with its electronic module should satisfy bending and twisting tests. It is accordingly necessary for the electronic module to be fixed properly if it is not to become detached under the action of twisting or bending, and it is moreover necessary for the electronic module itself to have such good mechanical properties that it does not run the risk of being itself destroyed when bending and twisting stresses are applied.

Among the electronic cards manufactured at present, a large number are referred to as disposable, that is to say that when data stored in the memory circuits of the integrated circuits implemented in the electronic module of the card has been used, new data cannot be loaded into the memory circuits and, therefore, the card becomes useless. This is typically the case with memory cards serving as telephone pre-payment cards. It will be understood that, in this case, it is necessary that the cost of manufacture of the card should be as low as possible, so that the manufacturing cost only represents a small percentage of the overall selling price of the card supplied to the user, this sale price essentially including the total services to which the user will be entitled in making use of the card.

The support part of the electronic module is most often formed in existing cards by means of a printed circuit, of which the external metal layer is etched to define the various external contact areas of the card. However, this technique is relatively costly. For this reason it has already been proposed in European patent application EP 0 254 640 to make the support part by means of a lead-frame.

According to the technique described in the European application cited above, a succession of patterns is formed in a conductive metal strip, each pattern corresponding to the creation of one electronic module. The various external electrical contact areas are separated from one another by cutting, the conductor parts thus obtained remaining connected mechanically to the remainder of the metal strip by bridges of small dimensions. In a first stage the semiconductor chip is fixed on one of the conductor parts; then the encapsulation of the semiconductor chip follows, in order to protect the chip and to effect an insulating mechanical connection between the ends of the conductor parts. The bridges merely then have to be cut to obtain an electronic module.

An object of the present invention is to provide a method of making an electronic module for a memory card, also using the lead-frame technique but allowing use of a thinner lead-frame, while still ensuring an even better mechanical bond between the conductor parts.

SUMMARY OF THE INVENTION

To achieve this object, the method of making an electronic module for a memory card comprises the following steps:

providing a strip of metal material having first and second faces;

cutting said strip to form a plurality of patterns, each pattern corresponding to a module and defining a plurality of peripheral flat conductor parts separate fran one another and connected mechanically to the remainder of said strip by bridges, and a central conductor part connected to one of the peripheral parts, the first face of each peripheral conductor part forming an external contact, each conductor part comprising an attachment end adjacent said bridges and a connection end;

a semiconductor chip is fixed on the second face of the central conductor part and the terminals of said chip are connected to said connection ends;

said pattern of said strip is placed in a transfer mold whose cavity comprises two cavity parts lying on the two sides of said metal strip;

a molding resin is introduced into said mold so as to fill said cavity parts and penetrate into the cuts in the metal strip, said cuts having dimensions in the region of the connection ends sufficient to allow said resin to pass from one part of the cavity to the other; and the mold is opened and said pattern is separated from the remainder of the metal strip by cutting said bridges.

It will be understood that the flat conductor parts are thus firmly held together by their connection ends, by virtue of the molded resin, which is present on both sides of these parts. Furthermore the introduction of the resin into the mold being effected under a very small pressure, the conductor parts do not risk being deformed, which makes it possible to use a metal strip of reduced thickness.

The invention also provides an electronic module comprising an assembly of flat peripheral conductor parts, whose first faces form external contacts, and a central conductor part connected to one of the peripheral conductor parts, the second face of each peripheral part defining a connection end and an attachment end, a semiconductor chip fixed to the second face of the central part, means electrically connecting the terminals of the chip to the connection ends of the conductor parts, and an encapsulation of insulating material, wherein said encapsulating material extends over the first faces of the conductor parts to cover said central part and only the connection ends of the peripheral parts, and over the second faces of the conductor parts to cover said semiconductor chip, while leaving free said attachment ends, the encapsulating material extending over said first faces having a thickness in the range 0.04 mm to 0.08 mm.

BRIEF DESCRIPTION OF THE DRAWINGS

An embodiment of the invention is described by way of example with reference to the accompanying drawings, in which:

FIG. 1 is a top view of a portion of the metal strip used in the invention;

FIG. 2 is a vertical section of a transfer mold which can be used to implement the method of the invention;

FIG. 3 is a top view of an electronic module of the invention; and

FIG. 4 is a vertical section on line IV—IV of FIG. 3.

DETAILED DESCRIPTION OF THE PREFERRED EMBODIMENT

In FIG. 1 there is shown a portion of a metal strip 10 which is used for making the electronic module. This metal strip has a thickness of 0.08 mm to 0.1 mm. This thickness is thus smaller than that of the lead-frames customarily used, the thickness of which is on the order of 0.2 mm. The metal which is used is preferably either a bronze or a nickel silver but it may be another alloy based on copper.

Separating cut-outs such as 12 and 14, which partially separate one lead-frame pattern A from the remainder of the metal strip 10, have been cut in the strip 10. The cut-outs 12 and 14 define a substantially rectangular shape. As can be seen in FIG. 1, the cut-outs 12 and 14 are divided from one another by bridges 16, 18, which thus mechanically connect the assembly of the pattern A to the remainder of the strip 10. Within the pattern A, the metal strip is cut to separate from one another the various electric contacts which are to form the electronic module. In the example shown in FIG. 1, there are eight electric contacts referenced 20, 22, 24, 2 4 28, 30, 32 and 34. It should be noted that the electric contact 28 is extended by a central contact 36, on which is fixed the semiconductor chip of the electronic module, as is explained below. Each electric contact or conductor part 20 to 34 comprises a connection end referenced a, which is adjacent the central contact 36, and an end b for mechanical bonding or attachment, which is connected to the bridges 16 or 18. Furthermore, the central contact 36 is connected to the remainder of the metal strip by two metal strips 38 and 40.

As is seen in FIG. 1, each conductor part 20 to 34 is separated from the adjacent parts by two elongate cut-outs c and d, which extend between the separating cut-outs 14 of the pattern A in relation to the remainder of the strip 10. As is also seen in FIG. 1, the cut-outs made near the connection ends a of the conductor parts 20 to 34 are large in area relative to the separating cut-outs c and d. The reason for this is explained below. It will also be seen that the connection end a of each conductor part has very small dimensions relative to the main portions of the conductor parts.

As shown in particular by FIG. 4, the following step of the method consists in fixing a semiconductor chip 40 on the back surface 36a of the central connection region 36, with the aid of a layer 42 of conductive adhesive. Accordingly, the contact part 36 extended by the contact part 28 forms the ground contact of the electronic circuits implemented in the semiconductor chip 40. With some integrated circuit technologies it is not necessary to have a ground contact on the back of the semiconductor chip. In this case, the central part 36 is merely an attachment part and the adhesive employed is insulating. The terminals 44 of the semiconductor chip are connected to the connection ends a of the conductor parts 20 to 34 by connecting wires 46. In FIG. 3 the conducting wires 46 are shown in dashed lines, extending from the connection ends a of the conductor parts to the terminals of the semiconductor chip 40.

The following step consists in forming the encapsulation of the chip 40 and the conducting wires 46 in an insulating material for mechanical protection. A transfer mold 50 shown in FIG. 2 is used for this. The mold 50 comprises a lower part 52, a middle part 53 and an upper part 54. The part 52 has a contact face 56 in which a cavity 58 of substantially cylindrical shape is formed, with a very small depth e on the order of 0.08 mm.

The part 53 of the mold defines in part a resin injection channel 60, the channel 60 being further formed by the part 54 of the mold in its face in contact with the part 53. The part 53 likewise comprises a support surface 64 opposite the support surface 56 of the part 52. A frusto-conical cavity 66 is set into the face 64. The upper wall of the cavity 66 is defined by the solid part 54 of the mold. The cavity 66 has dimensions at its base greater than those of the cavity 58. Furthermore the cavity 66 has dimensions large enough to surround the semiconductor chip 40 and its connecting wires 46 completely, as is shown in FIG. 2.

To effect the encapsulation of the semiconductor chip 40, the conductive strip 10 is placed between the parts 52 and 53 of the mold, as is shown in FIG. 2. Then the mold is closed tight, which results in the periphery of the metal strip corresponding to the pattern A being gripped between the support faces 64 and 56 of the mold parts. Then the part 54 is put in position. A tight connection is thus formed between these two mold parts and the strip 10. Next the molding resin is introduced by injection in liquid form. The resin is either liquid or it is liquefied by heat and, after a suitable setting time, removal from the mold is effected to obtain the electronic module shown in FIGS. 3 and 4.

When lifting off the part 54, the molding sprue is parted from the encapsulation 70 while the lead-frame is still gripped between the mold parts 53 and 52. Accordingly breaking off the molding sprue cannot involve any stress on the lead-frame.

Having regard to the shape of the mold cavity it will be seen that the insulating resin forms an encapsulation 70 for the semiconductor chip 40 which is placed on the face 10a of the metal strip and whose shape is well-defined by the walls of the cavity 66 of the mold. A second molded portion 72 is located on the rear face 10b of the metal strip 10 and is defined by the cavity 58 of the mold part 52. Finally, the resin penetrates equally into the cut-outs c and d and into the various openings in the central region of the lead-frame.

These portions of the molded material are referenced 74. Obviously there is no interruption in continuity between these three molded portions, and FIG. 4 only represents them differently so that the formation can be better understood. Likewise in FIG. 3 the portions of the molded part 74 which are hidden by the molded part 72 are shown hatched, whereas the exposed portions of the molded part 74 have been shown black.

It will be understood that, since the encapsulating material in the regions 70 and 72 is located on both sides of the metal strip 10 and since these encapsulating portions naturally overlap the connection ends a of the various conductor parts, very good reinforcement of the central part of the lead-frame results where the metal strip is provided initially with wide openings. An electronic module thus results whose various conductor parts are firmly connected together. The mechanical bond between the various conductor parts 20 to 34 is further reinforced by the presence of molding material inside the separating cut-outs c and d at least for the cutting off of the electronic module from the strip and its manipulation for inserting the module in the card body. It will be understood that the molding material 74 in the mold filling the cut-outs cannot overflow over to the faces 10a and 10b of the metal strip, since it is there gripped between the contact faces 64 and 56 of the transfer mold.

It is important to note that the connection ends a of each conductor part are narrow relative to the rest of the conductor part and in particular relative to its attachment end b and that they are buried in the mass of encapsulating material formed by the encapsulating portions 70, 72 and 74. In particular, only the connection ends a are covered by the encapsulating portion 72. An arrangement is thus obtained which enables the semiconductor chip to be mechanically decoupled from the attachment ends b of the conductor parts, these attachment ends b being for fixing to the card body.

Furthermore, it is noted that the large cut-outs formed in the metal strip towards the center of the pattern A promote the flow of the plastic material in passing from the cavity 66 of the part 54 to the cavity 58 of the part 52. This passage can thus be effected without altering the shape of the conductor parts. Furthermore the selected molding technique takes place under a very low pressure. Accordingly it is possible in particular to avoid any damage to the conducting wires 46 and their bonding to the conductor parts.

The thickness of the encapsulation 72 formed on the outer face of the electronic module is 0.05 mm to 0.10 mm, preferably 0.08 mm. That of the encapsulation formed on the inner face and encapsulating the semiconductor chip is on the order of 0.42 mm. The encapsulation 72 is circular and has a diameter of 5 mm. The encapsulation 70 surrounding the semiconductor chip is substantially square and has a side equal to 6 mm. As to the assembly of the pattern A, it has a substantially rectangular shape with dimensions equal to 10.6 mm and 12 mm. Moreover, the lengths of the connecting parts of the conductor parts are on the order of 0.5 mm while the width of the connection end and of its base part is on the order of 2 mm.

I claim:

1. A method of making an electronic module for a memory card, the method comprising the following steps:
   providing a strip of metal material having first and second faces;
   cutting said strip to form a plurality of patterns, each pattern corresponding to a module and defining a plurality of peripheral flat conductor parts separate from one another and connected mechanically to the remainder of said strip by bridges, and a central conductor part connected to one of the peripheral parts, the first face of each peripheral conductor part forming an external contact, each conductor part comprising an attachment end adjacent said bridges and a connection end;
   a semiconductor chip is fixed on the second face of the central conductor part and the terminals of said chip are connected to said connection ends;
   said pattern of said strip is placed in a transfer mold having a cavity which comprises a first cavity part on the second face of said central conductor part and accommodating the chip therein, and a second cavity part on the first face of said central conductor part and opposite said first cavity part;
   providing a resin inlet channel which opens into said first cavity part and not into said second cavity part;
   a molding resin is introduced via said resin inlet channel into said mold so as to fill said first and second cavity parts and penetrate into the cuts in the metal strip, said cuts having dimensions in the region of the connection ends sufficient to allow said resin to pass from one part of the cavity to the other; and
   the mold is opened and said pattern is separated from the remainder of the metal strip by cutting said bridges;
   wherein the second cavity part of the mold has a depth in the range 0.05 mm to 0.08 mm, and the first cavity part has a greater depth.

2. A method according to claim 1, wherein, for each peripheral conductor part, the connection end has a small width relative to the attachment end.

3. A method according to claim 1, wherein the dimensions of the cavity parts of the mold are so selected that only the connection ends of the peripheral conductor parts are entirely buried within the encapsulating resin.

4. A method according to claim 1, wherein said mold comprises a first mold part defining the second cavity part, a second mold part defining the periphery of the first cavity part and a third mold part defining an upper wall of the first cavity part, said second and third parts of the mold defining said resin inlet channel, said strip being gripped between said first and second parts of the mold.

* * * * *